(12) United States Patent
Hsue et al.

(10) Patent No.: US 6,391,713 B1
(45) Date of Patent: May 21, 2002

(54) METHOD FOR FORMING A DUAL DAMASCENE STRUCTURE HAVING CAPACITORS

(75) Inventors: Chen-Chiu Hsue, Hsinchu; Shyh-Dar Lee, Hsinchu Hsien, both of (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 09/854,872

(22) Filed: May 14, 2001

(51) Int. Cl.⁷ .......................................... H01L 21/8242

(52) U.S. Cl. ...................................... 438/253; 438/687

(58) Field of Search ................................ 438/238–240, 438/253–256, 381, 396–399, 687

(56) References Cited

U.S. PATENT DOCUMENTS 6,159,839 A * 12/2000 Jeng et al.
6,180,976 B1   1/2001 Roy

* cited by examiner

Primary Examiner—Jey Tsai
(74) Attorney, Agent, or Firm—Darby & Darby

(57) ABSTRACT

This invention provides a method for forming a dual damascene structure having capacitors. Before the thin-film capacitor is formed, the underlie interconnections are fabricated with Cu metal by damascene processes. The capacitor is formed by depositing a first metal layer, an insulator and a second metal layer. Then, the stacked layers are subjected to two masking and etching processes to form the thin-film capacitor and the metal wire. After forming the capacitor, the upper interconnections are fabricated with Cu metal by damascene processes.

12 Claims, 9 Drawing Sheets

METHOD FOR FORMING A DUAL DAMASCENE STRUCTURE HAVING CAPACITORS

BACKGROUND OF THE INVENTION

1. Field of the Invention

The present invention relates in general to the formation of an integrated circuit including capacitors. In particular, the present invention relates to a method for forming capacitors having uniform thickness of insulators while forming a damascene structure.

2. Description of the Related Art

Capacitors are integrated in various integrated circuits. For example, capacitors can be used as decoupling capacitors to provide improved voltage regulation and noise immunity for power distribution. These capacitors also have wide applications in analog/logic, analog-to-digital, mixed signal, radio frequency circuits and so on.

A conventional method of manufacturing a semiconductor apparatus including a capacitor 20 that is formed of metal-insulator-metal layers is described with reference to FIGS. 1A~1D. As shown in FIG. 1A, an aluminum layer is deposited on an insulator 12 which contains interconnections and is formed on a silicon substrate having devices (not shown) thereon and therein. The aluminum layer is then patterned by masking and etching to form wires 14a and 14b. As shown in FIG. 1B, an insulator 16 with a tungsten plug 18 (hereafter are referred to W-plug) for connecting the aluminum wire 14a and to-be-formed capacitor is formed on the aluminum wires 14a and 14b and the insulator 12. As shown in FIG. 1C, a first conductive plate 21, an insulator 22 and a second conductive plate 23 are sequentially deposited on the insulator 16 and the W-plug 18, and then patterned by masking and etching to constitute a capacitor 20. The first conductive plate 21, which is used as the bottom electrode, is connected with the aluminum wire 14a through the W-plug 18. Another insulator 26 is deposited on the insulator 16 and the capacitor 20. The insulators 16 and 26 are patterned to form W-plug 28a and W-plug 28b. As shown in FIG. 1D, an aluminum layer (not shown) is deposited on the insulator 26 and the W-plugs 28a and 28b. The aluminum layer is then patterned by masking and etching to form wires 34a and 34b. The aluminum wire 34a is connected with the second conductive plate 23 through the W-plug 28a. The aluminum wire 34b is connected with the aluminum wire 14b through the W-plug 28b.

The above-mentioned method for integrating the capacitor 20 into the integrated circuits is not cost-effective enough because it requires several masking steps to form the capacitor 20.

With the enhancements of the integration and the highly demanding speed of data transmission, the aluminum interconnections cannot satisfy these trends. Copper (Cu) has high electric conductivity to reduce RC delay and can be substituted for the aluminum as conducting wires. Using copper as the conducting wires need additional processes, that is, damascene processes. During the etching process using chlorine plasma, the boiling point of copper chloride ($CuCl_2$) produced by copper and chlorine can reach temperature as high as 1500° C., so copper cannot be patterned by conventional etching process.

A thin-film capacitor formed by combining with the Cu damascene processes is disclosed in U.S. Pat. No. 6,180,976 B1. In the '976 B1 patent, the bottom electrode of the thin-film capacitor is also formed by the damascene process. The '976 B1 patent has advantage of saving a masking step. However, a chemical mechanical polishing process is required to remove the undesirable metal material to form the bottom electrode. The dishing phenomenon is likely to occur on the bottom electrode and result in uneven surface. Therefore, the thickness of the insulator can not be controlled to be unvaried and uniform, thereby to stablize the electrical properies of the capacitors.

SUMMARY OF THE INVENTION

It is an object of the present invention to provide an improved method of forming a damascene structure having capacitors.

It is another object of the present invention to provide a method of forming a damascene structure having capacitors, which uses relatively fewer masking steps.

The present invention provides a method of forming a damascene structure having capacitors. Before fabricating the thin-film capacitor, a first Cu wire and a second Cu wire, surrouded with a barrier layer and a first sealing layer, are prepared in a first insulator. A second insulator and a stop layer are formed on the sealing layer in sequence. The first and second Cu plugs are disposed in the first sealing layer, the second insulator and the stop layer. A first metal layer, a fourth insulator and a second metal layer are formed on the stop layer in sequence. The second metal layer is subjected to photolithography and etching processes to become an upper electrode. Another photolithography and etching processes are then carried out to make the fourth insulator and the first metal layer to be pattened as a bottom electrode and a conducting wire. The bottom electrode is connected with the first Cu wire through the first Cu plug and the conducting wire is connected with the second Cu wire through the second Cu plug. A fifth insulator having a flat surface and dual damascene patterns therein is formed over the upper electrode, the fourth insulator and the stop layer. The third and fourth Cu wires with a second sealing layer thereon are formed in the trenches of the patterns and the third and fourth Cu plugs are formed in the holes of the patterns. The upper electrode is connected with the third Cu wire through the third Cu plug, and the conducting wire is connected with the fourth Cu wire through the fourth Cu plug.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

The present invention provides a method to fabricate a thin-film capacitor which can be integrated into the Cu damascene processes. The thin-film capacitor has an insulator with a uniform thickness and a flat surface. Before the thin-film capacitor is formed, the underlie interconnections are fabricated with Cu metal by damascene processes. The capacitor is formed by depositing a first metal layer, an insulator and a second metal layer. Then, the stacked layers are subjected to two masking and etching processes to form the thin-film capacitor and the metal wire. After forming the capacitor, the upper interconnections are fabricated with Cu metal by damascene processes.

First Embodiment

FIGS. 2A~2I depict the method for forming metal capacitors with uniform thickness of insulators by combining with damascene processes according to the first embodiment of the present invention.

Figure 1A:
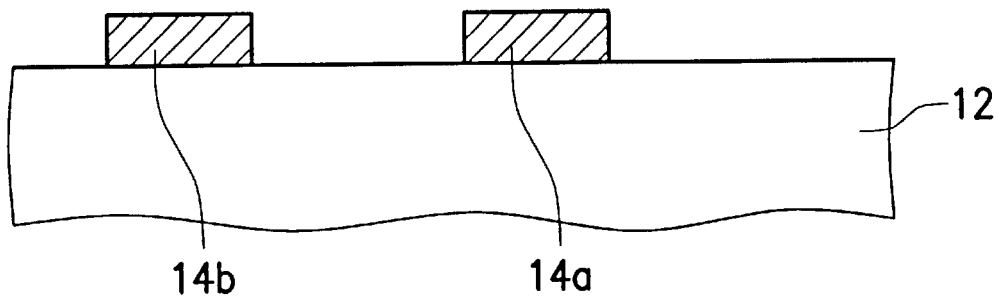
FIGS. 1A~1D depict the method for integrating the capacitors into the interconnection processes according to the prior art.
Figure 1B:
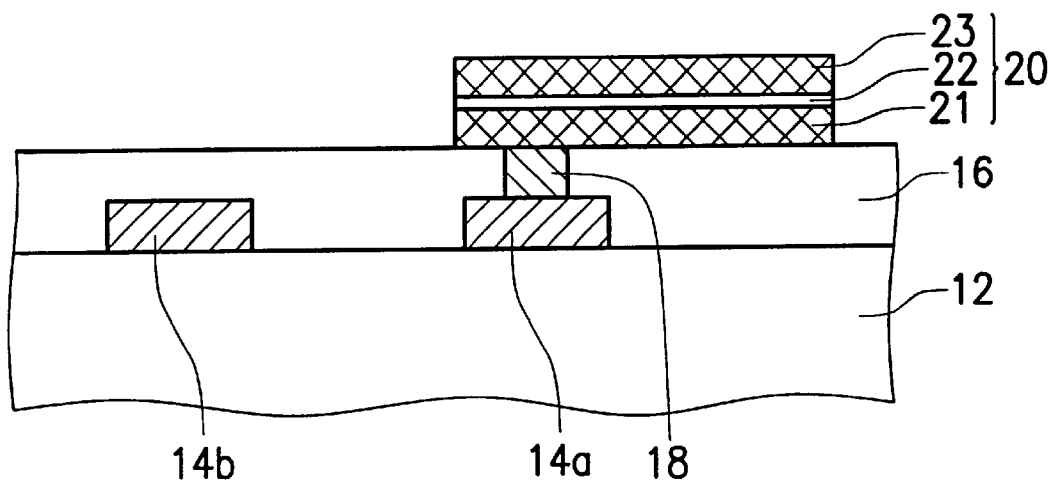
Figure 1C:
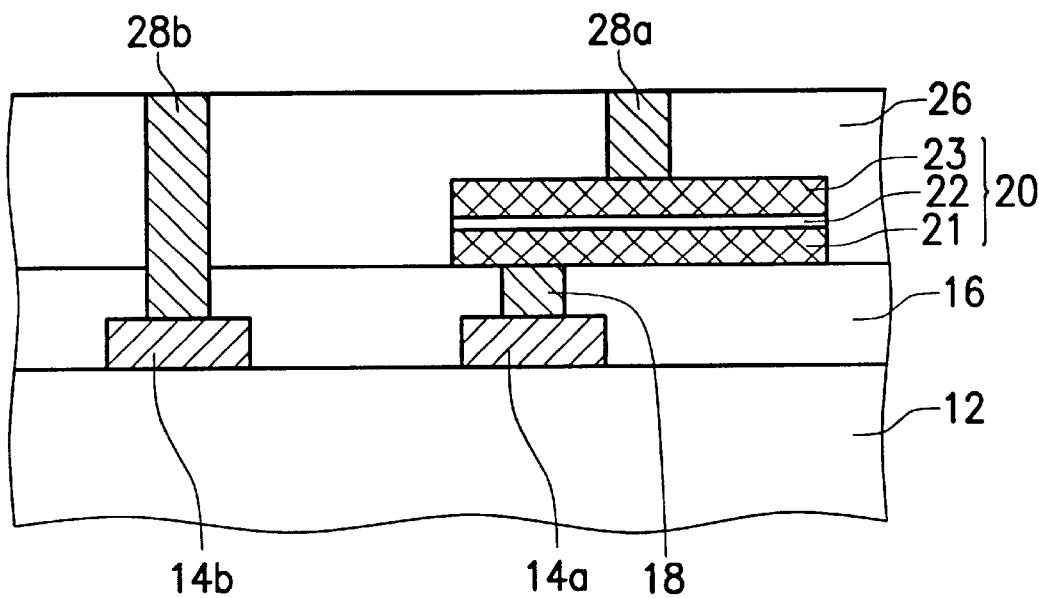
Figure 1D:
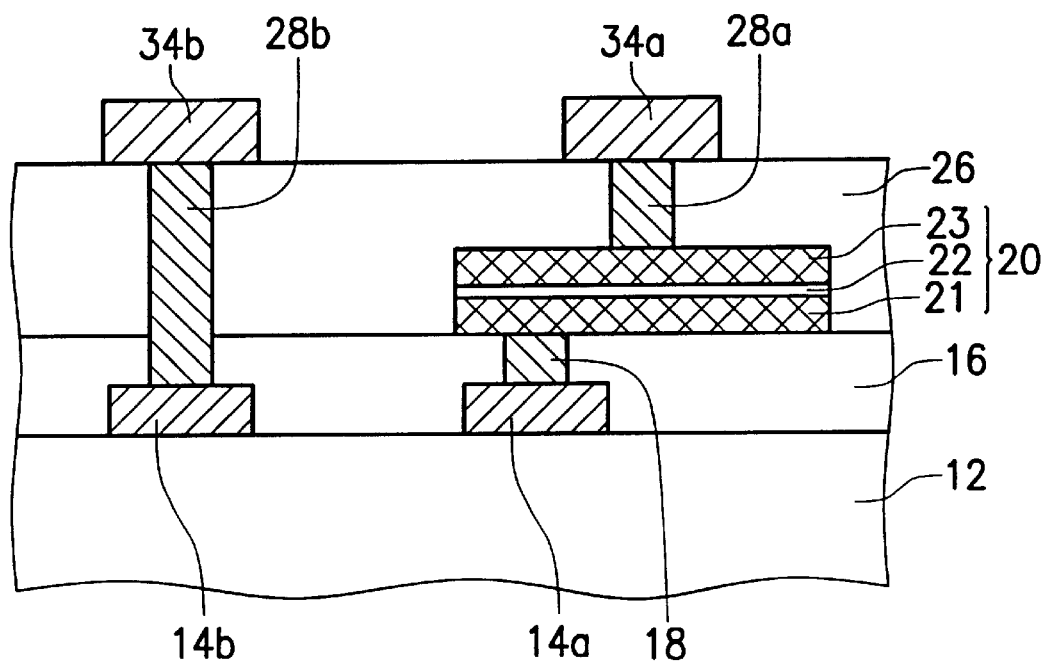
Figure 2A:
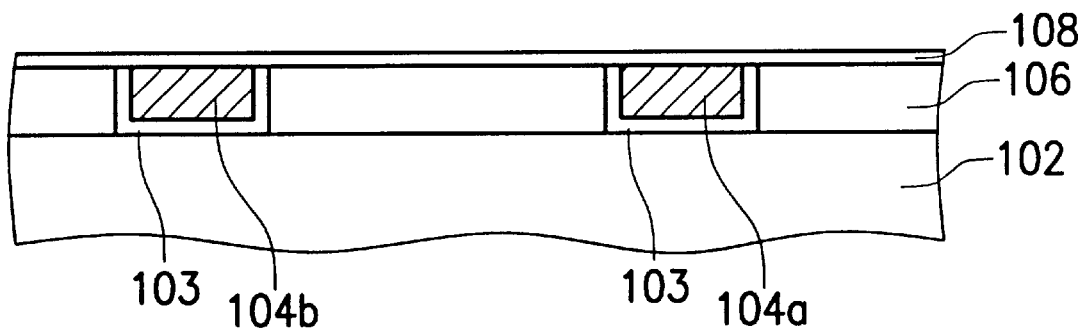
FIGS. 2A~2I depict the method for forming metal capacitors with uniform thickness of insulators by combining with damascene processes according to the first embodiment of the present invention.

Referring to FIG. 2A, the insulator 106 is formed on the insulator 102. The insulator 102 may include interconnections, and the insulator 102 is formed on a substrate, such as silicon semiconductor substrate, which include numerous devices thereon and therein. Those particular designs of the underlying integrated circuit has not been shown in order to more clearly describe and show the aspects of the present invention. Copper wires 104a and 104b, preferably about 2,000 Å~6,000 Å, are formed the insulator 106 by a damascene process. For example, firstly, trenches are formed in the insulator 106, and the barrier layer 103 is comfortably formed on the insulator 106. After copper metal is formed on the barrier layer 103 and filled in the trenched, a chemical mechanical polish process is executed to remove the undesirable copper and barrier layer 103. A sealing layer 108, preferably about 100 Å~400 Å in thickness, is formed at least on the Cu wires 104a and 104b. The material of the sealing layer 108 can be silicon nitride or silicon carbide.

Figure 2B:
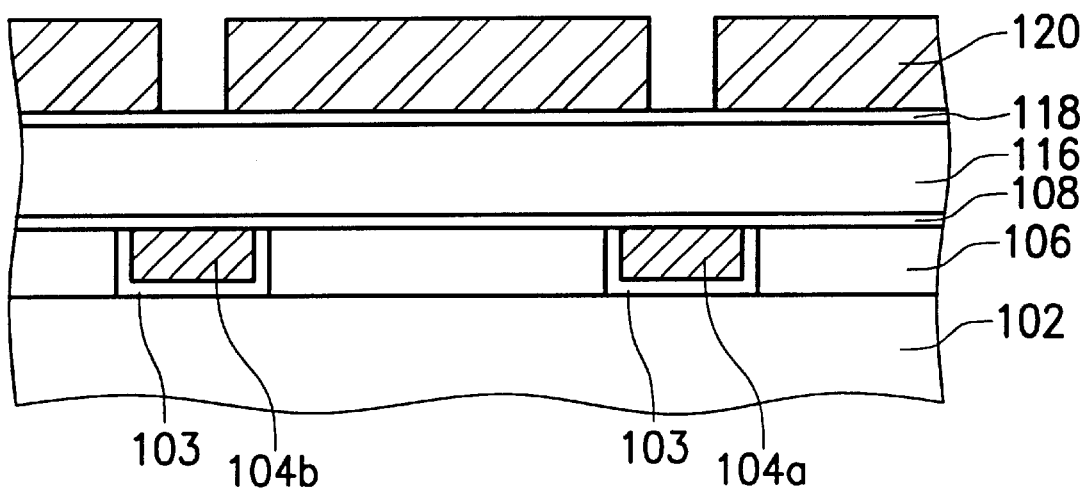

Referring to FIG. 2B, the insulator 116 and the insulator layer 118 which is acted as an etch stop layer are sequencially formed on the insulator 106 and the Cu wires 104a and 104b. The material of the insulator layer 118, such as silicon nitride (SiN), is different from that of the insulator 116, such as silicon dioxide ($SiO_2$). The photoresist layer 120 with via patterns is covered on the stop layer 118.

Figure 2C:
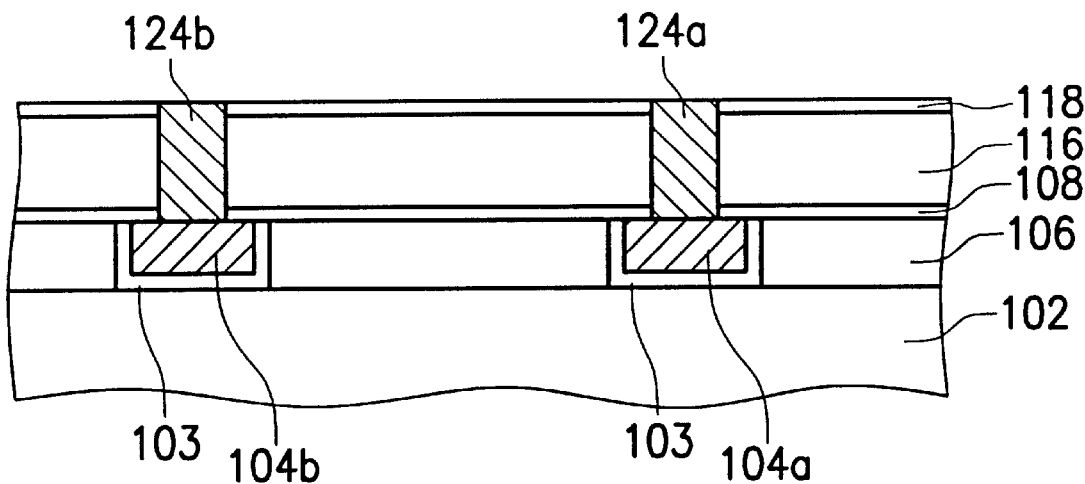

Referring to FIG. 2C, the via patterns of the photoresist layer 120 are transferred into the insulator 118, the insulator 116 and the sealing layer 108 to form vias exposed the contact regions of the Cu wires 104a and 104b. The photoresist layer 120 is then removed by, such as, a dry or wet process. The plugs 124a and 124b are formed in the vias by, such as, depositing a conformal barrier layer and a metal layer and polishing the undesirable portion with the planarization techniques, such as, a chemical mechanical polishing process. The plugs 124a and 124b can be Cu plugs or W plugs, preferably the former.

Figure 2D:
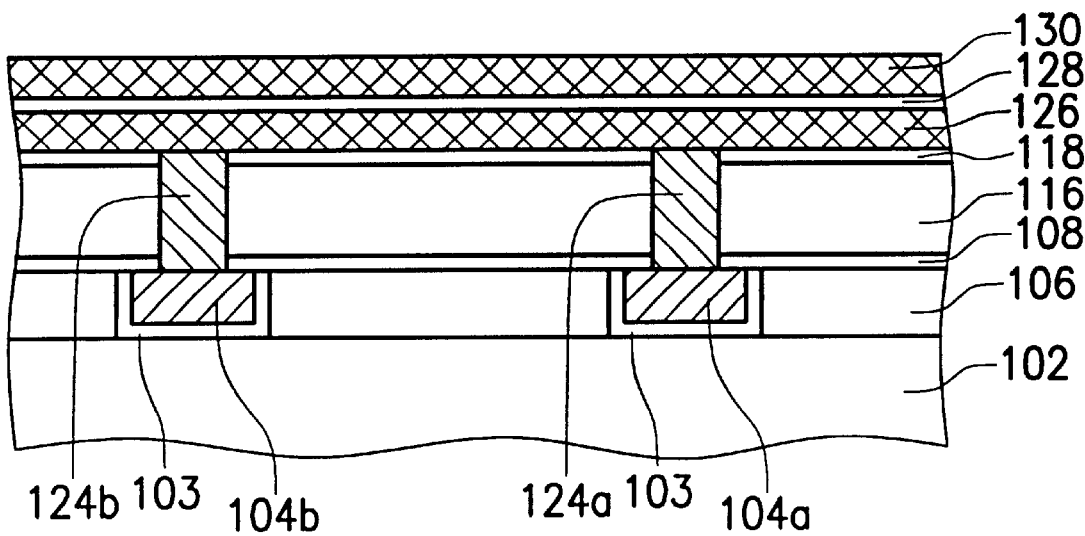

Referring to FIG. 2D, the metal layer 126, the insulator 128 and the metal layer 130 are formed on the insulator 118 and the plugs 124a and 124b. The metal layer 126, with a thickness ranging from about 300 Å to about 2,000 Å, is ready for forming the bottom electrode of the capacitor and conducting wires for a part of the interconnections. The insulator 128, with a thickness ranging from about 100 Å to about 1,200 Å, is ready for forming the capacitor, however, the particular thickness of this insulator 128 depends on a particular application of the capacitor with a desired capacitance. The metal layer 130, with a thickness ranging from about 200 Å to about 1,500 Å, is ready for forming the upper electrode of the capacitor. The material used to form the metal layer 130 can be titanium (Ti), titanium nitride (TiN), tantalum (Ta), tantalum nitride (TaN), aluminum (Al), aluminum copper alloy (AlCu), and the like. The material of the insulator 128 has a high dielectric constant, which can be silicon nitride (SiN), silicon oxynitride (SiON), silicon carbon (SiC), tantalum oxide (TaO), zirconium oxide (ZrO), hafnium oxide (HfO), aluminum oxide (AlO) or other high dielectric constant materials. The material used to form the metal layer 126 is a commonly used conductive material, such as aluminum (Al), aluminum copper alloy (AlCu), silver (Ag) or aurum (Au).

Figure 2E:
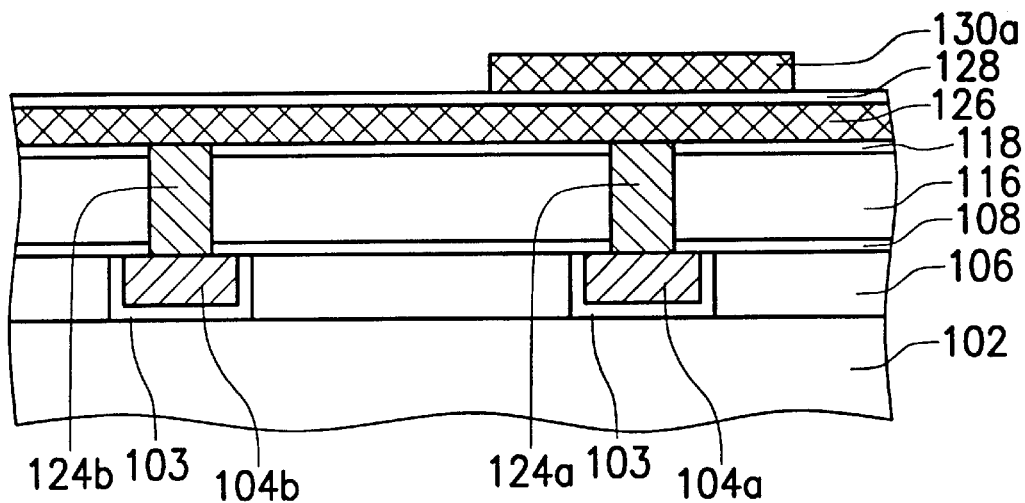

With Reference to FIG. 2E, the metal layer 130 is patterned to form the upper electrode 130a with a masking step and an etching step.

Figure 2F:
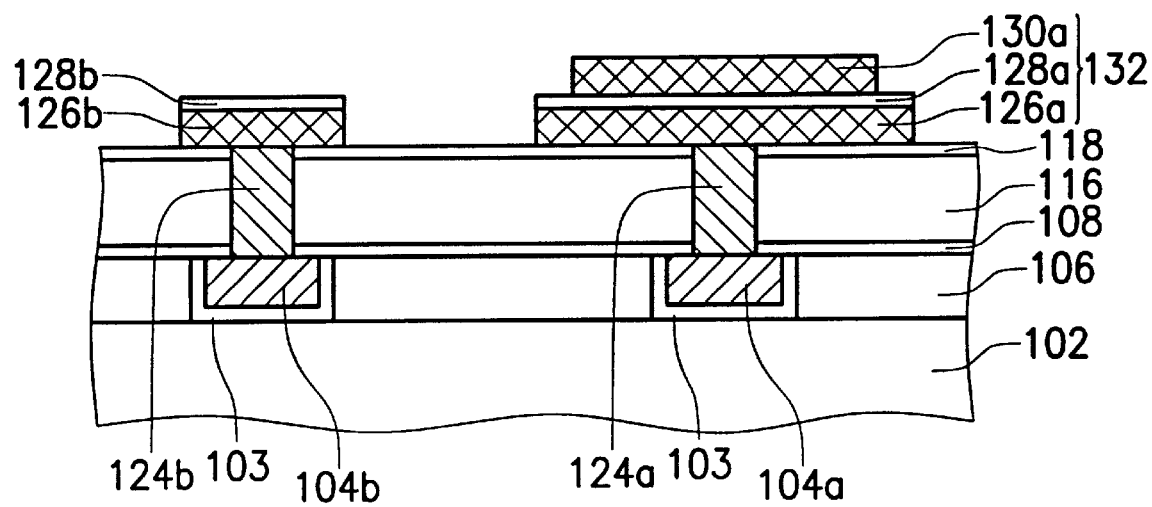

As shown in FIG. 2F, the insulator 128 and the metal layer 126 are patterned to form a conducting wire 126b and a bottom electrode 126a by proceeding another masking step and another etching step until the insulator 118 is exposed, wherein the insulator 118 acts as an etch stop layer. The insulator 128 is also transferred to an insulator 128b disposed on top of the conducting wire 126b and an insulator 128a disposed on top of the bottom electrode 126a after the masking and etching steps. The region of the bottom electrode 126a is substantially corresponding to that of the upper electrode 130a. The size of the bottom electrode 126a region is equal to or larger than that of the upper electrode 130a.

The conducting wire 126b is connected with the Cu wire 104b through the plug 124b.

A capacitor 132 is composed of the upper electrode 130a, the insulator 128a and the bottom electrode 126a. The bottom electrode 126a is connected with the Cu wire 104a through the plug 124a. The overlapped region between the upper electrode 130a and the bottom electrode 126a can produce capacitance effect. Therefore, the upper electrode 130a basically dominates the capacitance of the capacitor 132. When defining the upper electrode 130a, its area should be accurately controlled. In contrast, when defining the bottom electrode 126a, the process has relative high tolerance.

Compared to the U.S. Pat. No. 6,180,976 B1., the capacitor 132 of the present invention has a relatively uniform and even insulator 128a, because the bottom electrode 126a has a uniform and even surface formed by depositing and etching steps. Therefore, the capacitor 132 of the present invention can have better electrical properties.

Figure 2G:
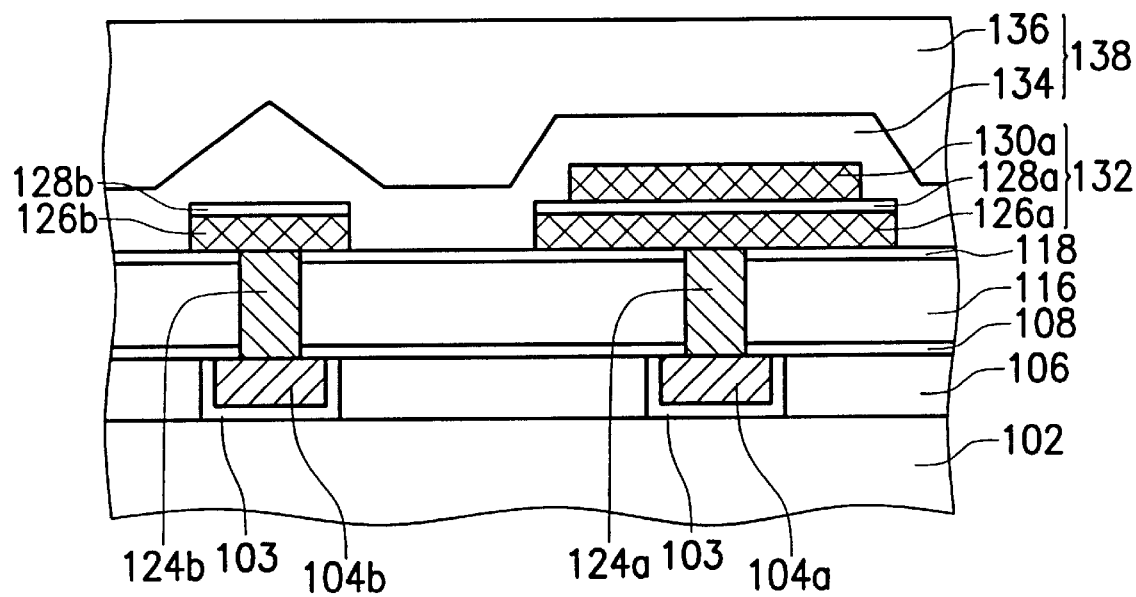

Now turning to FIG. 2G, an insulator 134 with a good gap filling capability is covered on the insulator 118, insulators 128a and 128b and the upper electrode 130a. The insulator 134 is formed by high density plasma technology to deposit the silicon oxide, or by coating the silicon-on glass (SOG) or silicon-on polymer (SOP). A blanket, sacrificial insulator 136 is formed on the insulator 134. The blanket, sacrificial insulator 136 is then subjected to a planarization process, such as a chemical mechanical polishing process. Therefore, the insulator 136 has a planar surface to facilitate the subsequent processes. For the convenience of description, the insulator 134 and the insulator 136 are referred to an insulator 138 in the following figures and specification.

Figure 2H:
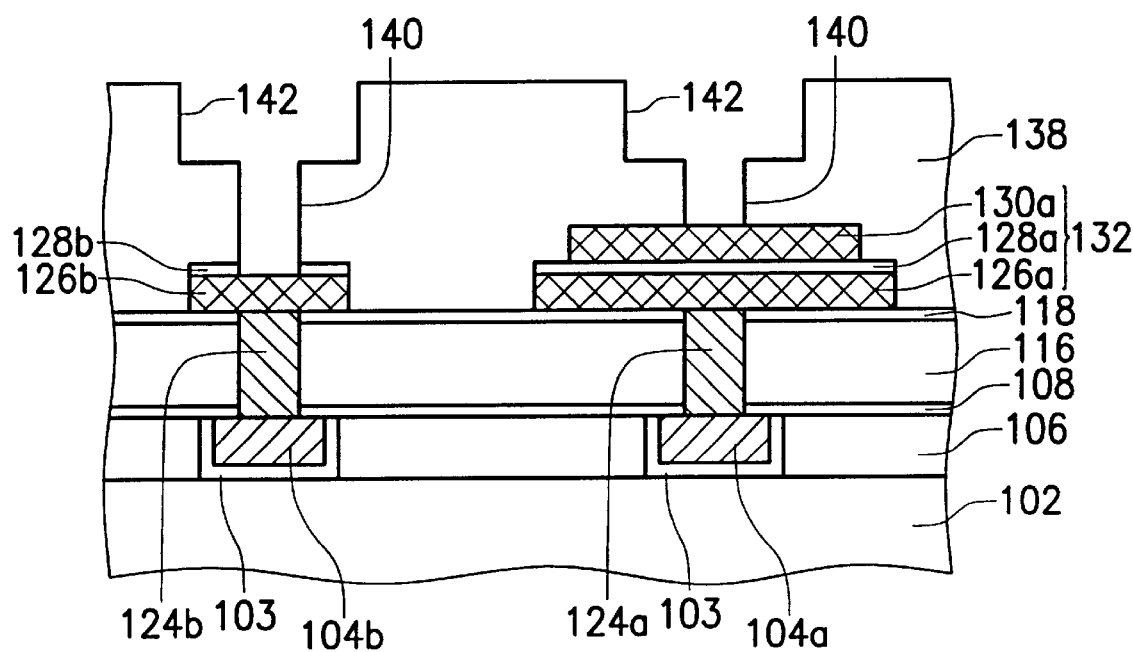
Figure 2I:
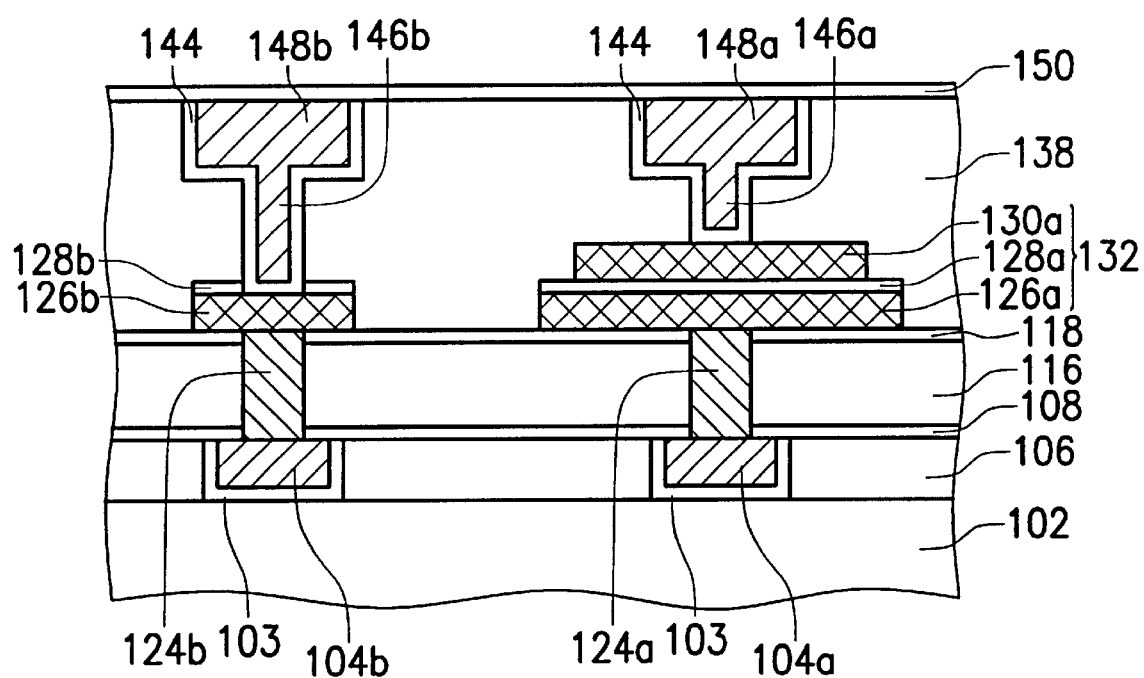

A dual damascene process is performed, as shown in FIGS. 2H and 2I. The dual damascene patterns including trenches 142 and vias 140 are formed in the insulator 138. The to-be-contact regions of the conducting wire 126b and the upper electrode 130a are exposed through the vias 140.

With Reference to FIG. 2I, a barrier layer 144 is conformally formed over the insulator 138, in the trenches 142 and vias 140. Cu metal is formed above the barrier layer 144 and filled in the trenches 142 and vias 140. A chemical mechanical polishing process is performed to remove the undesirable Cu metal and the barrier layer 144 to form Cu wires 148a and 148b and Cu plugs 146a and 146b. A sealing layer 150 is formed on the insulator 138 and the Cu wires 148a and 148b. The material used to fabricate the sealing layer 150 can be silicon nitride or silicon carbide, which are used to prevent the Cu atoms of the wires 148a and 148b from diffusion. The upper electrode 130a is connected with the Cu wire 148a through the Cu plug 146a, and the conductive wire 126b is connected with the Cu wire 148b through the Cu plug 146b.

The subsequent interconnection processes and Cu processes are performed to finish the whole interconnections.

The above-mentioned insulators 102, 106, 116, 134, and 136 can be formed by low dielectric constant (K) materials, such as doped or undoped silicon oxide, SOP low K material, such as FLARE®, Si4C®, PAE-II® and so on, and CVD low K material, such as breakdiamond™ (BD™), Coral™, Greendot™, Aurora™ and so on.

Second Embodiment

Figure 3A:
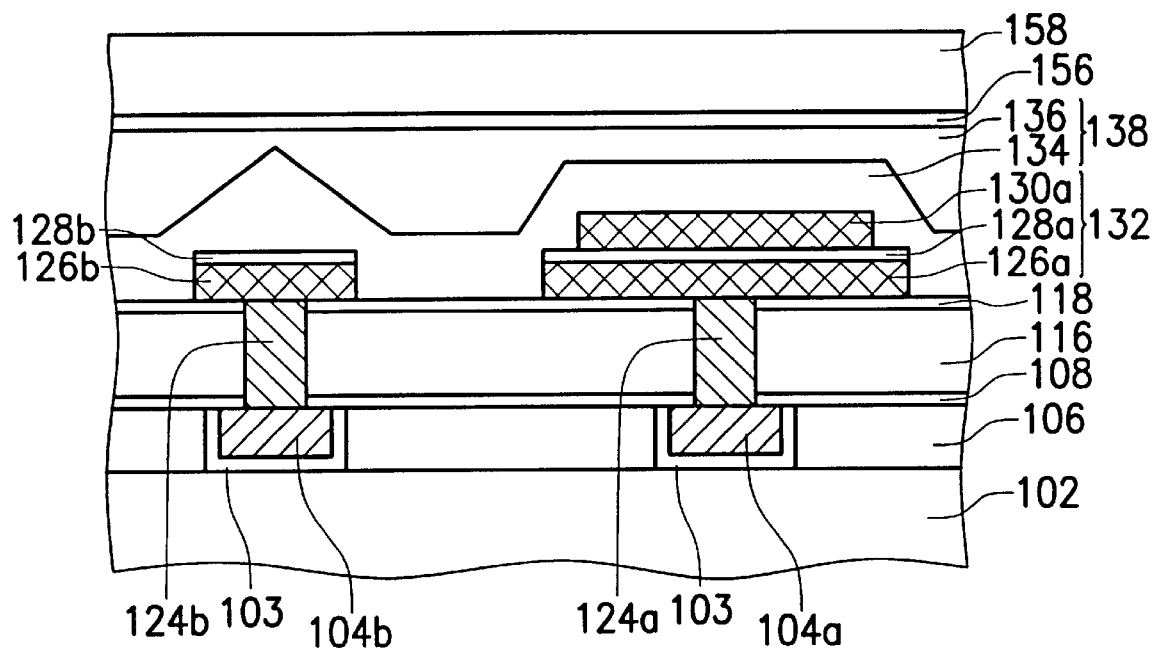
FIGS. 3A~3C depict the method for forming metal capacitors with uniform thickness of insulators by combining with another damascene processes according to the second embodiment of the present invention.
Figure 3B:
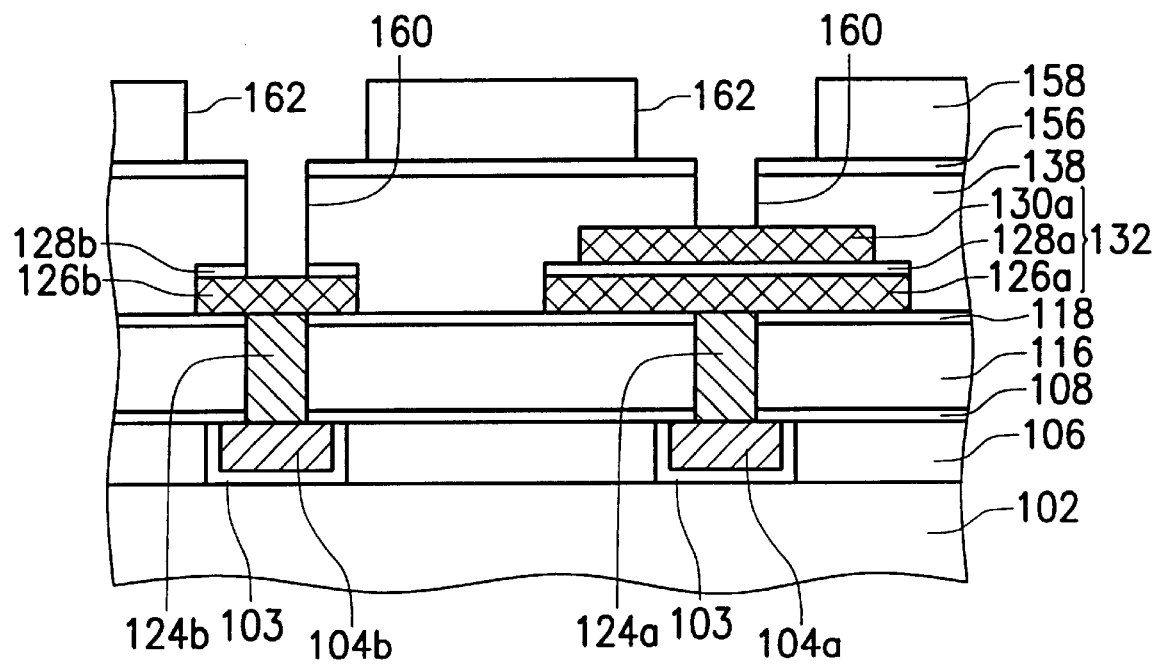
Figure 3C:
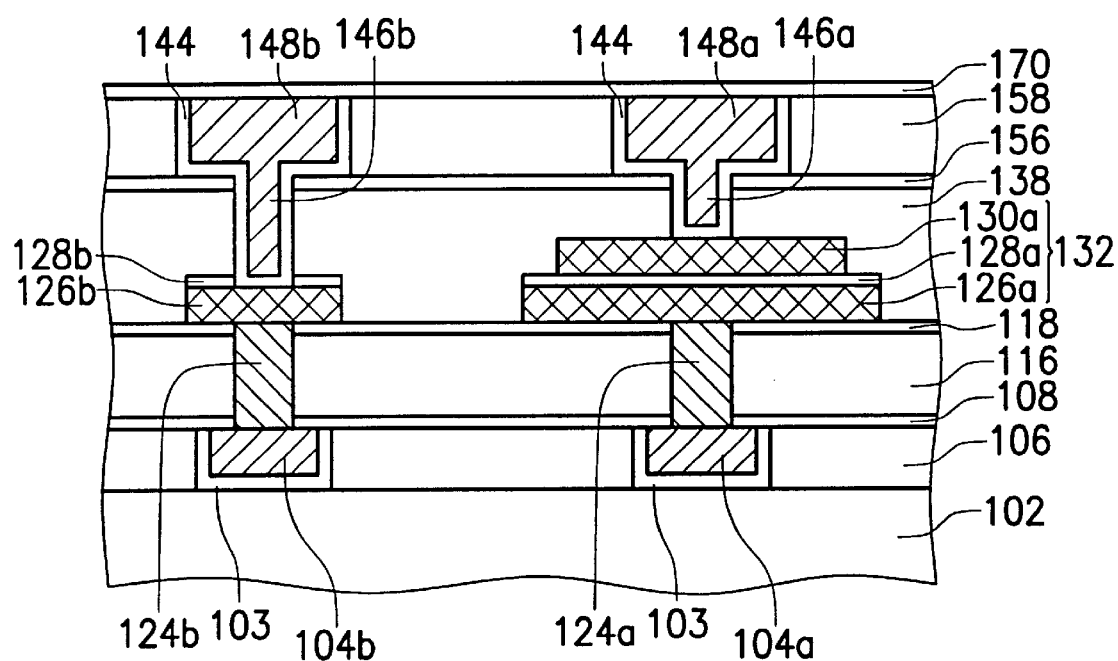

FIGS. 3A~3C depict the method for forming metal capacitors of uniform thickness by combining with another damascene processes according to the second embodiment of the present invention.

The method of forming the capacitor 132 with an uniform, flat insulator 128a and the conducting wire 126b is described in FIGS. 2A~2F.

After forming the capacitor 132, the upper interconnections are fabricated with Cu metal by another damascene process.

Now turning to FIG. 3A, an insulator 134 with a good gap filling capability is covered on the insulator 118, insulators 128a and 128b and the upper electrode 130a. The insulator 134 is formed by high density plasma to deposit the silicon oxide, or by coating the silicon-on glass (SOG) or silicon-on polymer (SOP). A blanket, sacrificial insulator 136 is formed on the insulator 134. The blanket, sacrificial insulator 136 is then subjected to a planarization process, such as a chemical mechanical polishing process. Therefore, the insulator 136 has a planar surface to facilitate the following process to carry out. For the convenience of description, the insulator 134 and the insulator 136 are referred to a insulator 138 in the following figures and specification. It should be noted that the total thickness of the insulator 138 is substantially equal to the height of the to-be-formed vias. Another thin insulator 156 with via patterns is disposed on the flat insulator 138 to be a hard mask. The material used to form the thin insulator 156 can be silicon nitride. An thick insulator 158 is formed on the thin insulator 156. The thickness of the insulator 158 is substantially equal to the height of the to-be-formed wires.

The dual damascene patterns are formed, as shown in FIG. 3B. The Dual damascene patterns including trenches 162 and vias 160 are formed in the insulator 158 and insulator 138, respectively. The to-be-contact regions of the conducting wire 126b and the upper electrode 130a are exposed through the vias 160.

With Reference to FIG. 3C, a barrier layer 144 is conformally formed on the insulators 158 and 138, in the trenches 162 and vias 160. Cu metal is formed above the barrier layer 144 and filled in the trenches 162 and vias 160. A chemical mechanical polishing process is performed to remove the undesirable Cu metal and the barrier layer 144 to form Cu wires 148a and 148b and Cu plugs 146a and 146b. A sealing layer 170 is formed on the insulator 158 and the Cu wires 148a and 148b.

The above-mentioned insulators 102, 106, 116, 134, 136 and 158 can be formed by low dielectric constant (K) materials, such as doped or undoped silicon oxide, SOP low K material, such as FLARE®, Si4C®, PAE-II® and so on, and CVD low K material, such as breakdiamond™ (BD™), Coral™, Greendot™, Aurora™ and so on.

Compared to the prior art showed in FIGS. 1A~1D, both of the Cu dual damascene processes and Al process are used in the present invention. Because the Cu dual damascene processes are introduced, the line width of the interconnections can be easily scaled down and the circuit performance can be improved. Morover, when the bottom electrode is fabricated by masking and etching, the conductive wire is also fabricated at the same time. Thus, only an additional mask is required to form the upper electrode, thereby to reduce the fabrication cost.

Again, compared to the U.S. Pat. No. 6,180,976 B1., the insulator of the capacitor in the present invention has low variation in thickness.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A method for forming a dual damascene structure having capacitors, comprising:

providing a first insulator;

forming a first Cu wire and a second Cu wire in the first insulator by executing a damascene process;

forming a first sealing layer on the first insulator and the first and the second Cu wires;

forming a second insulator on the first sealing layer;

forming a third insulator acting as an etch stop layer on the second insulator;

forming a first Cu plug and a second Cu plug in the first sealing layer, the second insulator and the third insulator;

forming a first metal layer on the third insulator and the first and second Cu plugs;

forming a fourth insulator on the first metal layer;

forming a second metal layer on the fourth insulator;

patterning the second metal layer to form an upper electrode;

patterning the fourth insulator and the first metal layer, wherein the first metal layer is transferred into a bottom electrode and a conducting wire, wherein the bottom electrode is connected with the first Cu wire through the first Cu plug and the conducting wire is connected with the second Cu wire through the second Cu plug;

forming a fifth insulator with a flat surface on the upper electrode, the fourth insulator and the third insulator;

forming dual damascene patterns including trenches and holes in the fifth insulator;

forming a third Cu wire and a fourth Cu wire in the trenches and a third Cu plug and a fourth Cu plug in the holes, wherein the upper electrode is connected with the third Cu wire through the third Cu plug, and the conducting wire is connected with the fourth Cu wire through the fourth Cu plug; and forming a second sealing layer on the third and fourth Cu wires and the fifth insulator.

2. The method as claimed in claim 1, wherein the material of the first metal layer is selected from the group consisting of Al, AlCu, Cu, Ag, and Au.

3. The method as claimed in claim 1, wherein the material of the fourth insulator is selected from the group consisting of silicon nitride (SiN), silicon oxynitride (SiON), silicon carbide (SiC), tantalum oxide (TaO), zirconium oxide (ZrO) hafnium oxide (HfO), and aluminum oxide (AlO).

4. The method as claimed in claim 1, wherein the material of the second metal layer is selected from the group consisting of titanium (Ti), titanium nitride (TiN), tantalum (Ta), tantalum nitride (TaN), aluminum (Al), and aluminum copper alloy (AlCu).

5. The method as claimed in claim 1, wherein the region of the bottom electrode is equal to that of the upper electrode.

6. The method as claimed in claim 1, wherein the region of the bottom electrode is larger than that of the upper electrode.

7. The method as claimed in claim 1, wherein the thickness of the second metal layer is ranging from 200 Å to 1,500 Å.

8. The method as claimed in claim 1, wherein the thickness of the first metal layer is ranging from 300 Å to 2,000 Å.

9. The method as claimed in claim 1, wherein the step of forming the fifth insulator further comprises forming a hard mask therein.

10. The method as claimed in claim 9, wherein the thickness of the fifth insulator above the hardmask is substantially equal to the height of the third and fourth Cu wires.

11. The method as claimed in claim 9, wherein the thickness of the fifth insulator below the hard mask is substantially equal to the height of the third and fourth Cu plugs.

12. The method as claimed in claim 9, wherein the material of the hard mask is silicon nitride.

* * * * *